United States Patent
Chan et al.

(10) Patent No.: US 9,935,174 B2
(45) Date of Patent: Apr. 3, 2018

(54) GAP FILL OF METAL STACK IN REPLACEMENT GATE PROCESS

(71) Applicant: International Business Machines Corporation, Armonk, NY (US)

(72) Inventors: Victor Chan, Guilderland, NY (US); Jin Ping Han, Yorktown Heights, NY (US); Shangbin Ko, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/372,519

(22) Filed: Dec. 8, 2016

(65) Prior Publication Data

US 2017/0179256 A1 Jun. 22, 2017

Related U.S. Application Data

(62) Division of application No. 14/973,780, filed on Dec. 18, 2015.

(51) Int. Cl.
*H01L 29/66* (2006.01)
*H01L 29/49* (2006.01)
*H01L 29/78* (2006.01)
*H01L 21/225* (2006.01)
*H01L 21/283* (2006.01)
*H01L 23/535* (2006.01)

(52) U.S. Cl.
CPC .... *H01L 29/66545* (2013.01); *H01L 21/2253* (2013.01); *H01L 21/283* (2013.01); *H01L 23/535* (2013.01); *H01L 29/4975* (2013.01); *H01L 29/66515* (2013.01); *H01L 29/66553* (2013.01); *H01L 29/78* (2013.01); *H01L 29/7845* (2013.01)

(58) Field of Classification Search
CPC ......... H01L 29/66; H01L 29/49; H01L 29/78; H01L 29/4975; H01L 29/7845; H01L 29/66545; H01L 29/66515
USPC ....................................................... 257/412
See application file for complete search history.

(56) References Cited

U.S. PATENT DOCUMENTS

| | | |
|---|---|---|
| 6,835,610 B2 | 12/2004 | Sayama et al. |
| 6,905,976 B2 | 6/2005 | Beintner et al. |
| 7,517,746 B2 | 4/2009 | Lin et al. |
| 7,883,950 B2 | 2/2011 | Hong |

(Continued)

*Primary Examiner* — Chuong A Luu
(74) *Attorney, Agent, or Firm* — Fleit Gibbons Gutman Bongini Bianco PL; Thomas S. Grzesik (57) ABSTRACT

A method for fabricating a semiconductor device comprises forming a replacement gate structure on a semiconductor layer of a substrate. The replacement gate structure at least including a polysilicon layer. After forming the replacement gate structure, a gate spacer is formed on the replacement gate structure. Atoms are implanted in an upper portion of the polysilicon layer. The implanting expands the upper portion of the polysilicon layer and a corresponding upper portion of the gate spacer in at least a lateral direction beyond a lower portion of the polysilicon layer and a lower portion of the spacer, respectively. After the atoms have been implanted, the polysilicon layer is removed to form a gate cavity. A metal gate stack is formed within the gate cavity. The metal gate stack includes an upper portion having a width that is greater than a width of a lower portion of the metal gate stack.

20 Claims, 12 Drawing Sheets

(56) References Cited

U.S. PATENT DOCUMENTS

| | | |
|---|---|---|
| 7,993,997 B2 | 8/2011 | Ho et al. |
| 8,264,048 B2 | 9/2012 | Rachmady et al. |
| 8,466,503 B2 | 6/2013 | Anderson et al. |
| 8,519,454 B2 | 8/2013 | Guo et al. |
| 8,753,929 B2 | 6/2014 | Anderson et al. |
| 9,048,254 B2 | 6/2015 | Chen et al. |
| 2004/0043549 A1* | 3/2004 | Sayama ............ H01L 21/28044 438/197 |
| 2008/0296707 A1* | 12/2008 | Anderson ......... H01L 21/26506 257/412 |

* cited by examiner

GAP FILL OF METAL STACK IN REPLACEMENT GATE PROCESS

The present disclosure generally relates to the field of semiconductors, and more particularly relates to improving gap fill of the metal stack in replacement gate processes. This application is Division of application Ser. No. 14/973,780, filed on Dec. 18, 2015, now U.S. Pat. No. 9,748,358.

BACKGROUND OF THE INVENTION

As gate sizes decrease for replacement metal gates (RMG) it becomes more difficult for conventional RMG processes to completely fill the metal gate stack. As device scaling increases, conventional solutions will become even more limited.

SUMMARY OF THE INVENTION

In one embodiment, a method for fabricating a semiconductor device is disclosed. The method comprises forming a replacement gate structure on a semiconductor layer of a substrate. The replacement gate structure at least comprising a polysilicon layer. After forming the dummy gate structure, a gate spacer is formed on the replacement gate structure. Atoms are implanted in an upper portion of the polysilicon layer. The implanting expands the upper portion of the polysilicon layer and a corresponding upper portion of the gate spacer in at least a lateral direction beyond a lower portion of the polysilicon layer and a lower portion of the gate spacer, respectively. After the atoms have been implanted, the polysilicon layer is removed to form a gate cavity surrounded by the gate spacer. A metal gate stack is formed within the gate cavity and in contact with sidewalls of the gate spacer. The metal gate stack comprises a upper portion having a width that is greater than a width of a lower portion of the metal gate stack.

In another embodiment, a semiconductor device is disclosed. The semiconductor device comprises a semiconductor layer formed on a substrate. Silicide areas are formed on source and drain regions. A replacement gate is formed over the semiconductor layer. The replacement gate comprises a upper portion having a width that is greater than a width of a lower portion of the replacement gate stack.

In yet another embodiment, an integrated circuit is disclosed. The integrated circuit comprises a semiconductor device. The semiconductor device comprises a semiconductor layer formed on a substrate. Silicide areas are formed on source and drain regions. A replacement gate is formed over the semiconductor layer. The replacement gate comprises a upper portion having a width that is greater than a width of a lower portion of the replacement gate stack.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

It is to be understood that the present disclosure will be described in terms of a given illustrative architecture; however, other architectures, structures, substrate materials and process features and steps may be varied within the scope of the present disclosure.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

Figure 1:
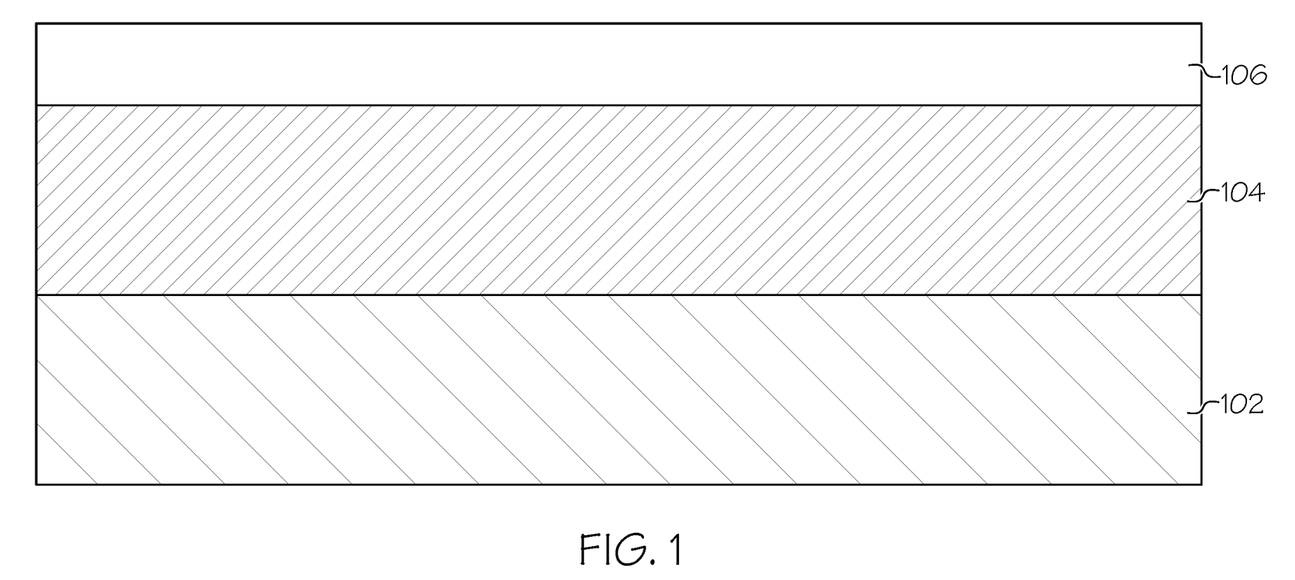
FIG. 1 is a cross-sectional view of an initial semiconductor structure according to one embodiment of the present disclosure.

Referring now to the drawings in which like numerals represent the same of similar elements, FIGS. 1-11 illustrate various processes for improving gap fill of the metal stack in a replacement gate process. It should be noted that one or more embodiments of the present invention are applicable to both bulk substrate devices and silicon-on-insulator (SOI) devices. FIG. 1 shows a partially fabricated semiconductor device 100 comprising a handle substrate 102, a buried insulator layer (e.g., buried oxide (BOX)) 104, and a semiconductor layer 106. The handle substrate 102 can be a semiconductor substrate comprising a single crystalline semiconductor material such as single crystalline silicon, a polycrystalline semiconductor material, an amorphous semiconductor material, or a stack thereof. The thickness of the handle substrate 102 can be, for example, from 50 microns to 1,000 microns, although lesser and greater thicknesses can also be employed. A buried insulator layer 104 includes a dielectric material such as silicon oxide, silicon nitride, silicon oxynitride, or any combination thereof.

The thickness of the buried insulator layer 104 can be, for example, from 50 nm to 500 nm, although lesser and greater thicknesses can also be employed. The thickness of the semiconductor layer 106 can be, for example, from 3 nm to 60 nm, and typically from 5 nm to 10 nm, although lesser and greater thicknesses can also be employed. The semiconductor layer 106 can comprise any semiconducting material, including but not limited to Si (silicon), strained Si, SiC (silicon carbide), Ge (geranium), SiGe (silicon germanium), SiGeC (silicon-germanium-carbon), Si alloys, Ge alloys, GaAs (gallium arsenide), InAs (indium arsenide), InP (indium phosphide), any combination thereof, as well as other III/V or II/VI compound semiconductors and alloys thereof. Also, nFET and pFET devices formed from the structure of FIG. 1 can include a semiconductor layer 106 with different materials.

Figure 2:
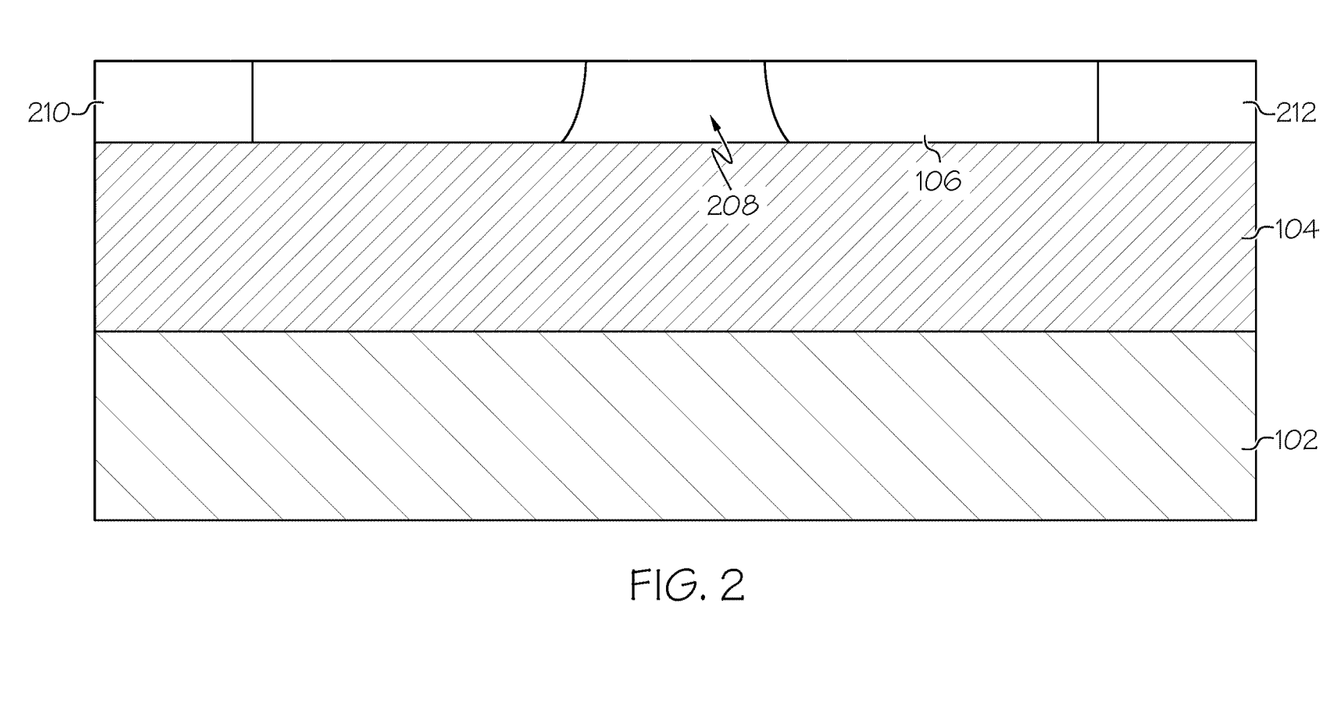
FIG. 2 is a cross-sectional view of the semiconductor structure after an active area has been defined according to one embodiment of the present disclosure.

An active area 208 for the FET is defined within the semiconductor layer 106 through pad-film deposition, patterning (e.g., by photolithography), and reactive-ion etching (RIE), as shown in FIG. 2. For example, a pad oxide having a thickness of 2 nm to 10 nm is formed in an oxidation furnace, and a pad nitride is deposited over the pad oxide using low-pressure chemical vapor deposition (LPCVD) or rapid-thermal chemical vapor deposition (RTCVD). Photolithography and a nitride-oxide-silicon RIE are then performed to define the active area 208.

Next, the active area 208 is isolated, such as through shallow trench isolation (STI). In this embodiment, STI is obtained through deposition of an STI oxide, densification anneals, and chemical-mechanical polishing (CMP) that stops on the pad nitride. For example, shallow trench isolation structures can be formed by trenches extending from the top surface of the semiconductor layer 106 at least to the top surface of the buried insulator layer 104, filling the trenches with a dielectric material, and removing excess dielectric material from above the top surface of the top semiconductor layer 106. The STI structures 210, 212 are formed above the BOX layer 104 that is continuous around the active area 208. The pad nitride, along with any STI oxide remaining on the pad nitride, and the pad oxide are then removed (e.g., through wet etching using hot phosphoric acid and HF).

Figure 3:
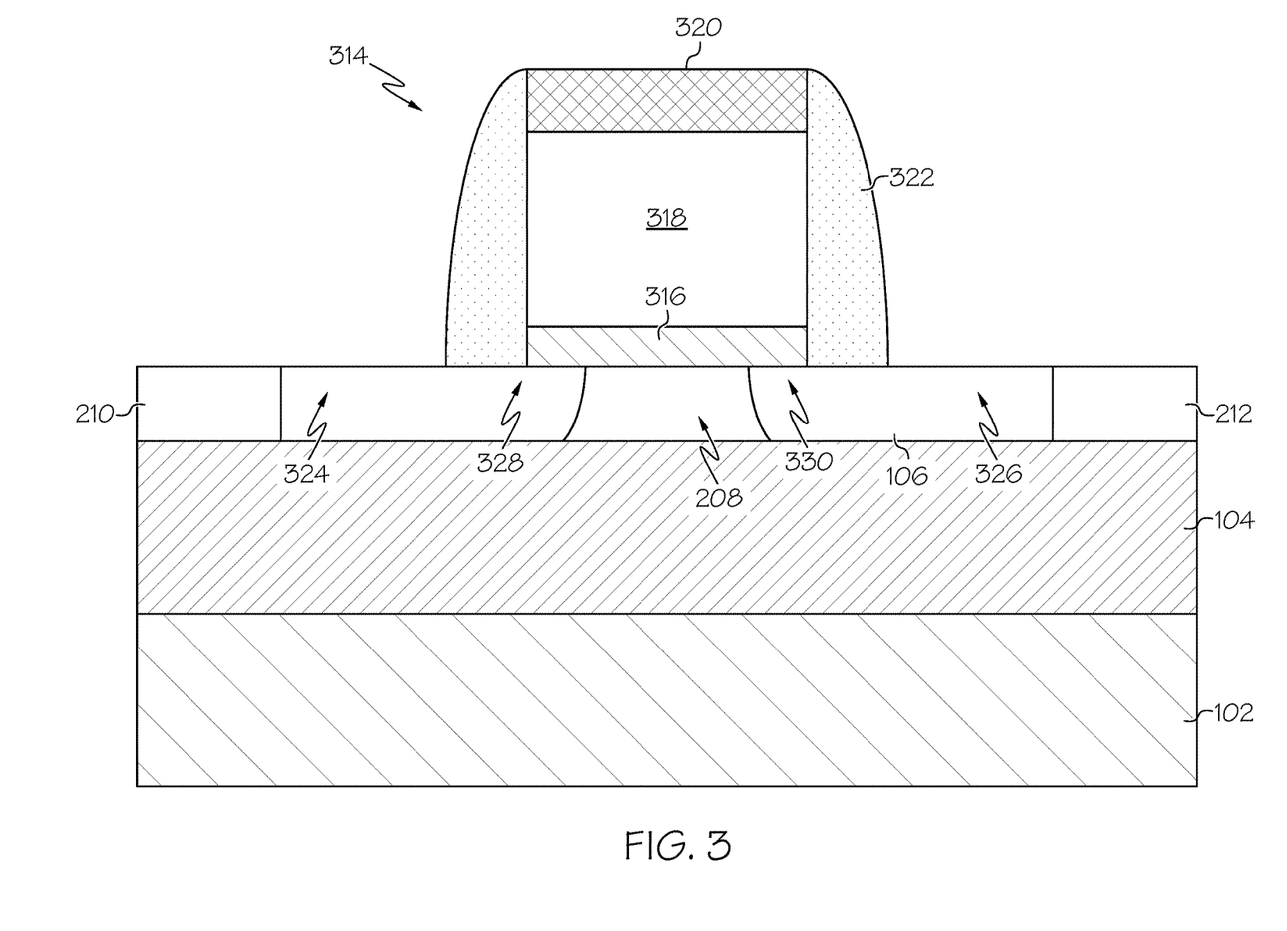
FIG. 3 is a cross-sectional view of the semiconductor structure after a replacement gate structure has been formed according to one embodiment of the present disclosure.

A replacement (or dummy) gate structure 314 is then formed on the active area 206 of the FET, as shown in FIG. 3. In this embodiment, the replacement gate 314 comprises multiple layers of oxide, polysilicon, amorphous silicon, nitride, or a combination thereof. For example, FIG. 3 shows that the replacement gate comprises a gate dielectric 316 formed on the active area 208 on the semiconductor layer 106 by, for example, chemical vapor deposition (CVD) processes, thermal oxidation, or wet chemical oxidation. In embodiments, the dielectric layer 316 can be any high-k dielectric layer such as, for example, hafnium aluminum oxide, zirconium oxide, silicate, or any combination thereof in a stack structure. A polysilicon layer 318 or any other disposable material such as amorphous silicon is then formed on and in contact with the dielectric layer 316 using a deposition process such as CVD. This replacement gate stack acts as a place holder for the actual gate stack to be formed after a gate expansion process is performed. Also, in some embodiment, an interfacial layer (not shown) is formed on and in contact with the semiconductor layer 106 prior to forming the dielectric layer 316. In this embodiment, the dielectric layer 316 is formed on and in contact with the interfacial layer. A hard mask 320 is formed on and in contact with the polysilicon layer 318 using, for example a CVD process. The hard mask 320 can comprise oxide, nitride, silicon nitride, and/or the like.

A gate spacer 322 comprising a dielectric material (such as silicon oxide, silicon nitride, silicon oxynitride, or a combination of these) is formed on the sidewalls of the replacement gate stack 314 comprising the dielectric layer 314, polysilicon layer 318, and the hard mask 320. In the illustrated embodiment, the dielectric material is formed and then reactive-ion etching is used to remove the dielectric material except from the sidewalls of the replacement gate 314. It should be noted that the replacement gate 314 and the gate spacer 322 can be formed prior to forming the STI structures. Once the replacement gate 314 and spacer 322 have been formed source and drain regions 324, 326 and source and drain extension regions 328, 330 are formed within the semiconductor layer 106. In one embodiment, these semiconductor portions 324, 326, 328, 330 are formed by introducing electrical dopants such as boron (B), gallium (Ga), indium (In), phosphorous (P), arsenic (As), and/or antimony (Sb) by ion implantation, plasma doping, and/or gas phase doping employing various masking structures as known in the art. In one embodiment, a thermal anneal can be performed to activate and diffuse the implanted ions so as to form the source/drain regions 324, 326 and 428 and the source/drain extensions 328, 330, such as through a spike rapid-thermal anneal (RTA).

Figure 4:
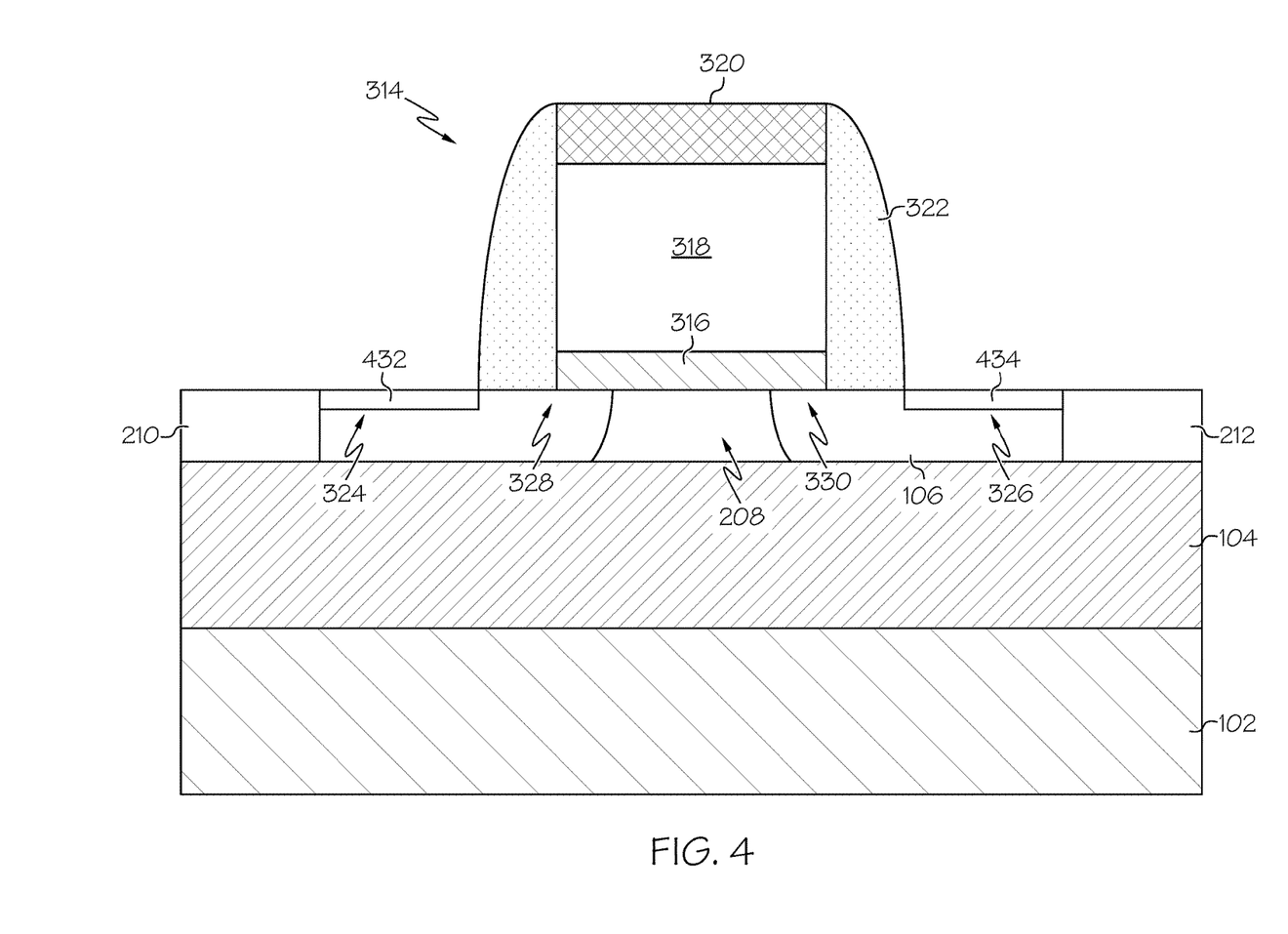
FIG. 4 is a cross-sectional view of the semiconductor structure after silicide areas have been formed according to one embodiment of the present disclosure.
Figure 5:
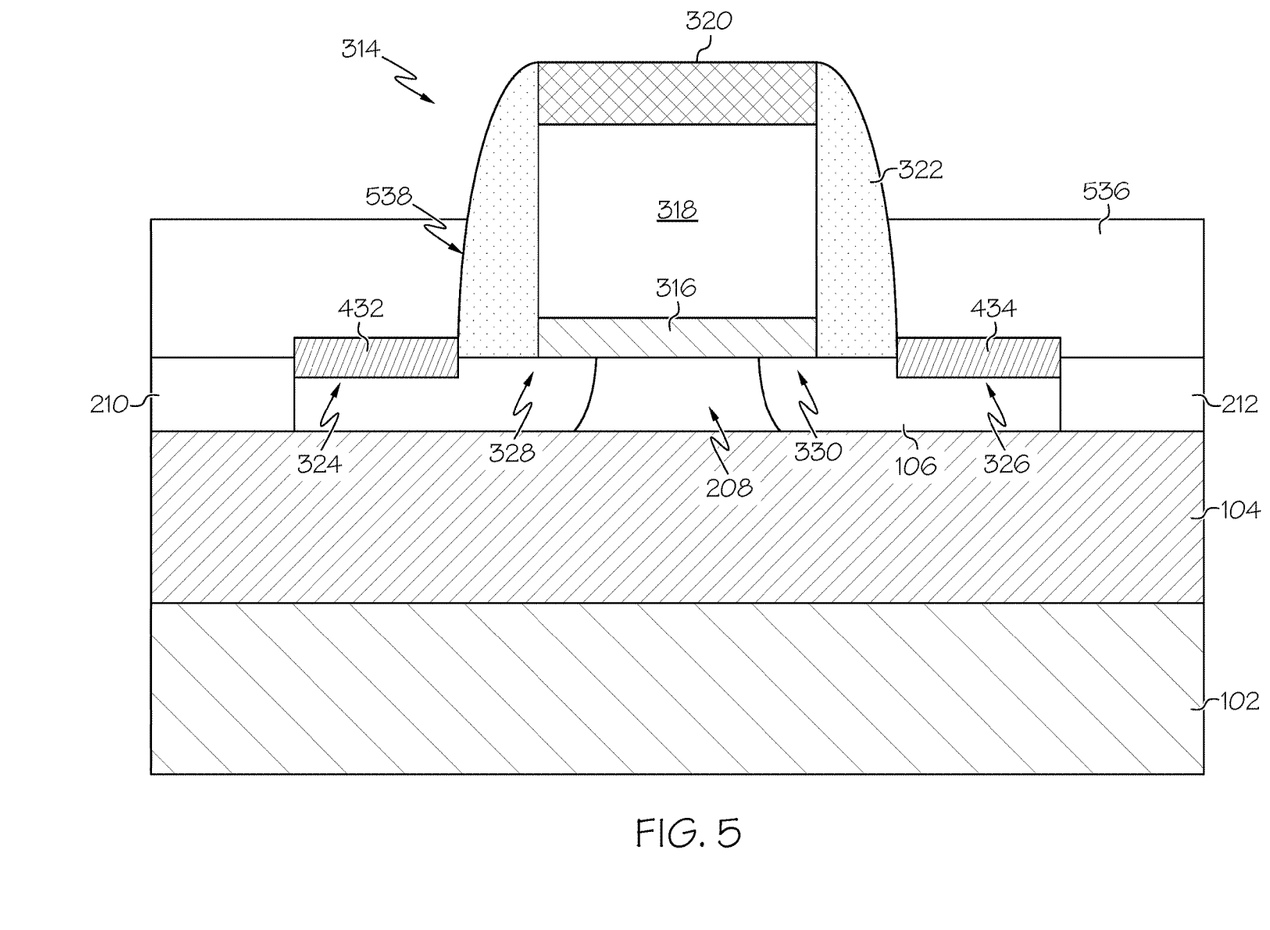
FIG. 5 is a cross-sectional view of the semiconductor structure after disposable material later have been formed thereon according to one embodiment of the present disclosure.

Silicide areas 432, 434 are formed for contacts on the source/drain regions 324, 326 of the FET, as shown in FIG. 4. In this embodiment, a metal is deposited on top of the source/drain regions 324, 326. An anneal is then performed to form silicide, and then the metal is selectively removed. For example, the metal can be nickel, cobalt, titanium, platinum, or an alloy or combination thereof. FIG. 5 shows that after the silicide areas 432, 434 have been formed a disposable material layer 536 is formed over and in contact with the STI structures 210, 212, any portion of the semiconductor layer 106 (if any) between the silicide areas 432, 434 and the spacer 322, and the silicide areas 432, 434. The disposable material layer 536, in one embodiment, also contacts the sidewall 538 of the spacer 322. The disposable material layer 536 comprises a thickness or height protects the silicide areas from subsequent etching of the hard mask 320 formed on the replacement gate 314 and a subsequent implantation of germanium into the replacement gate 314. For example, the disposable material layer 536 can comprise a thickness of greater than 200 A and less than the height of the gate. The disposable material layer 536 comprises a self-planarizing material such as flowable oxide (FOX) or a spin-on glass, or can comprise a non-self-planarizing material. In one embodiment, the disposable material layer 536 can be deposited by spin-on coating of a self-planarizing material. In another embodiment, the disposable material layer 536 can be formed by deposition of a disposable material by chemical vapor deposition, planarization of the deposited disposable material, for example, by chemical mechanical planarization (CMP), and by recessing the top surface of the planarized disposable material, for example, by a recess etch, which can be a wet etch or a dry etch.

Figure 6:
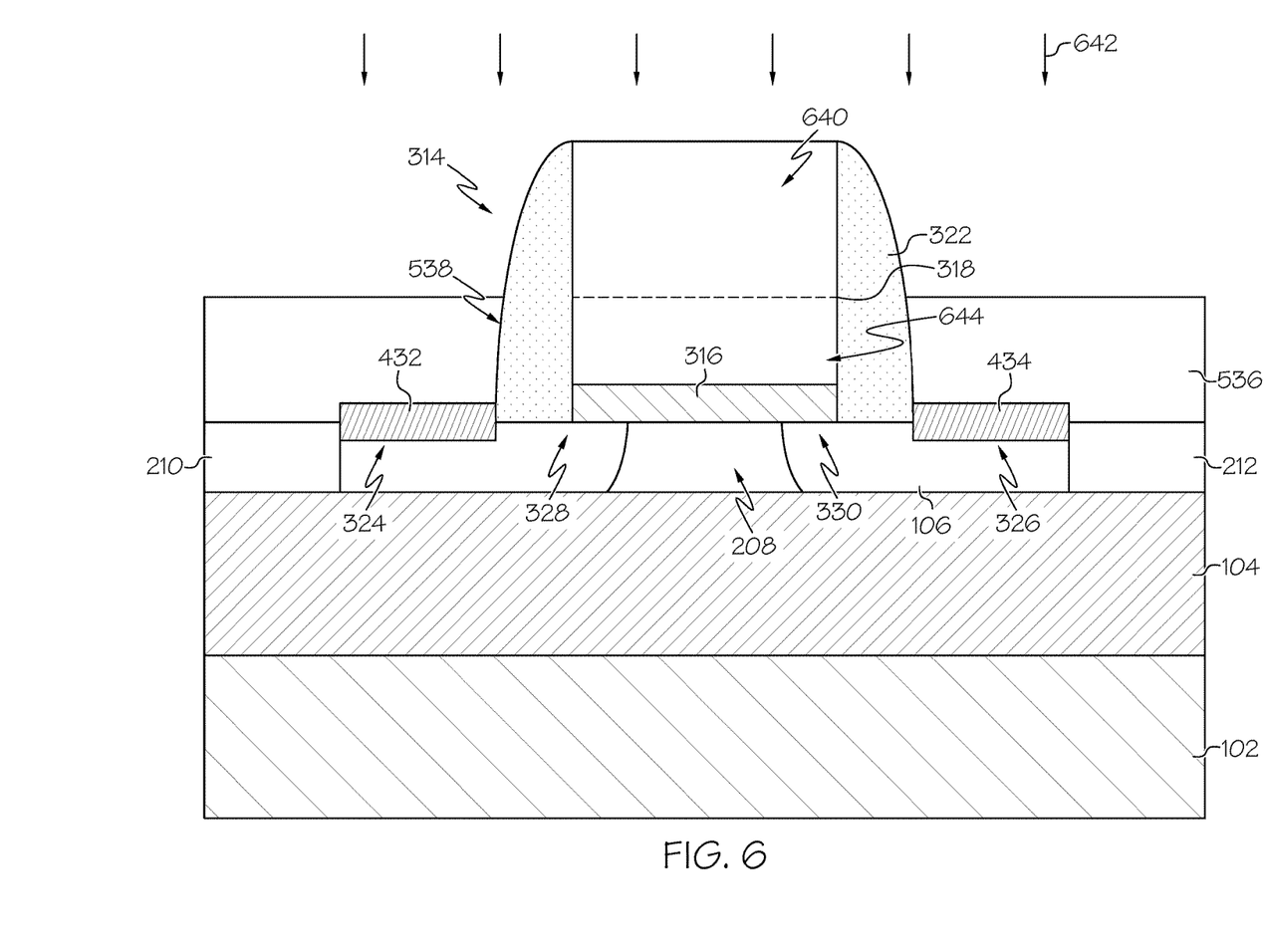
FIG. 6 is a cross-sectional view of the semiconductor structure showing an implantation process that expands an upper portion of a polysilicon layer in the replacement gate structure according to one embodiment of the present disclosure.

Once the disposable material layer 536 has been formed, a controlled etching process can be performed to remove the hard mask 320 and a portion of the spacer 322. The etching of the spacer 322 can stop at or below a top surface of the polysilicon layer 318. In one embodiment, the etching process is a selective reactive ion etching (RIE) process that is selective to the material of the hard mask 320 and the spacer 322, and does not remove portions of the polysilicon layer 318. In one embodiment, germanium atoms are implanted in an upper/top portion 640 of the exposed polysilicon layer 318 of the replacement gate 314 by ion implantation in a direction indicated by arrows 642, as shown in FIG. 6. The germanium implantation process uses germanium atoms at a high dose ($>10^{15}$ Ge atoms/cm$^2$) and at a low energy (i.e., an energy level where the germanium atoms only penetrate through a top portion 640 of the polysilicon layer of the replacement gate 314 and not into a lower/bottom portion 644). The directions 642 can be vertical or tilted between, for example, 5 and 45 degrees from vertical. Other angles are applicable as well. As a result of this germanium implantation process, the top portion 640 of the polysilicon layer 318 expands laterally, as shown in FIG. 7.

Figure 7:
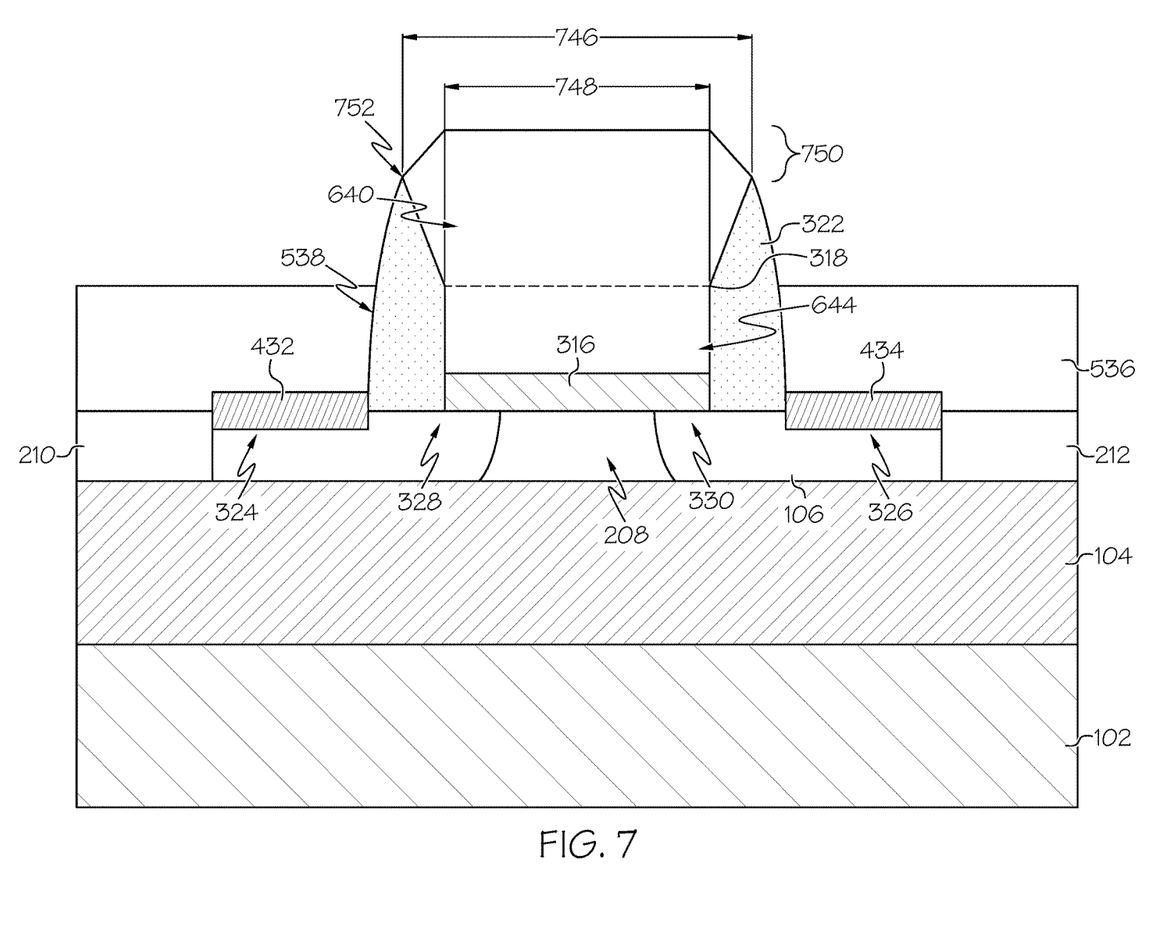
FIG. 7 is a cross-sectional view of the semiconductor structure after the implantation process of FIG. 6 has been performed according to one embodiment of the present disclosure.

As a result of the lateral expansion of the top portion 640, a width 746 of the top portion 640 is greater than a width 748 of the bottom portion 644 of the polysilicon layer 318, as shown in FIG. 7. In one embodiment, the top portion 640 of the polysilicon layer 318 is expanded laterally at least 10%. In other words, the width 746 is at least 110% of the width 748. In addition, an upper region 750 of the top portion 640 of the polysilicon layer 318 extends above and over a top surface 752 of the spacer 322. In some embodiments, the top portion 640 of the polysilicon layer 318 comprises angles sidewalls, whereas the bottom portion 644 of the of the polysilicon layer comprises vertical sidewalls. The expanded areas improve gap fill during a subsequent RMG process. For example, the funnel shape of the empty gate allows the Work function metal (WFM) and bulk metal (such as Al and W) the fill gate gap easier. Otherwise, if gate top opening is small and pinched-off the metal cannot fill into the gate forms voids.

Figure 8:
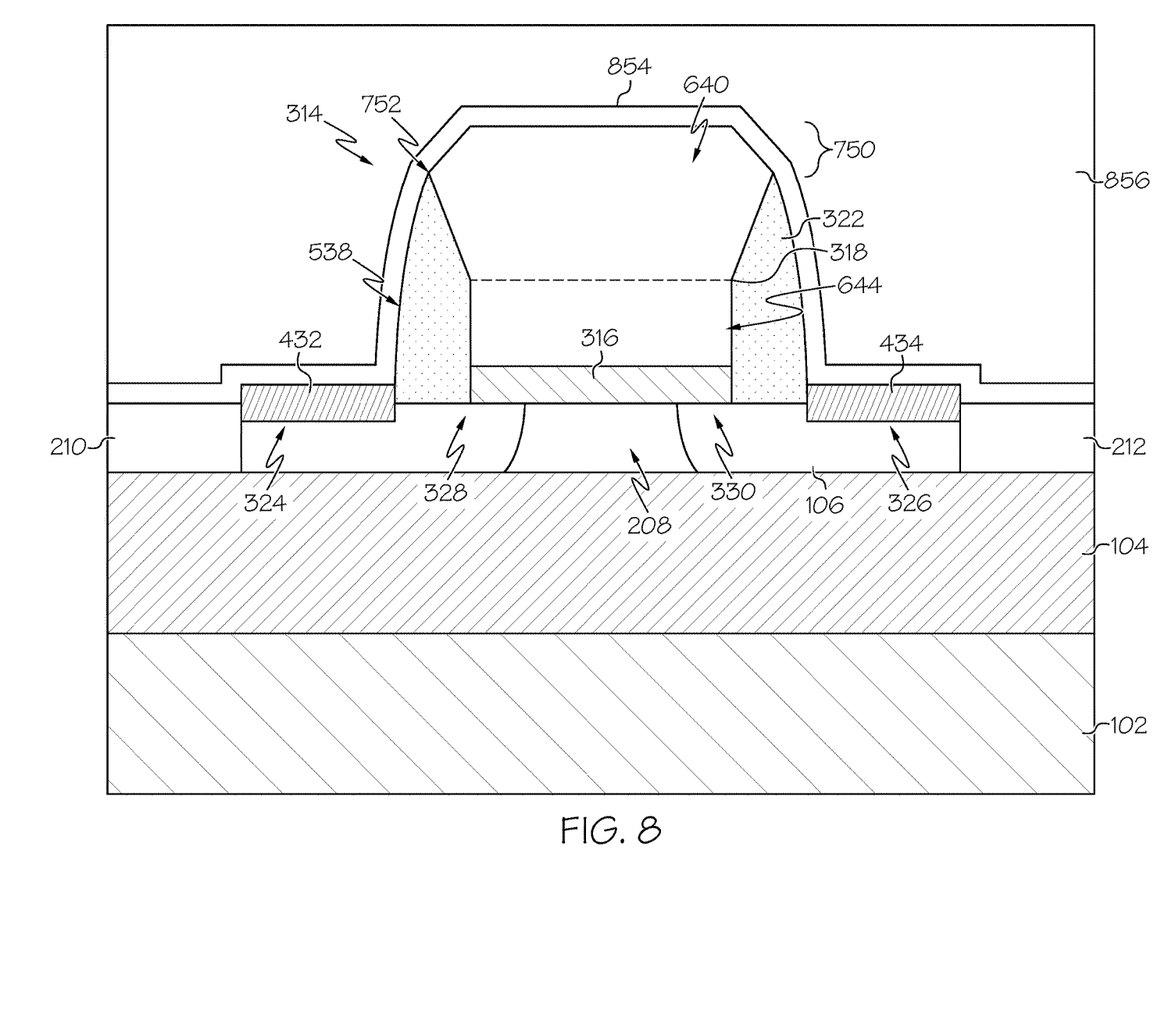
FIG. 8 is a cross-sectional view of the semiconductor structure after a contact etch-stop liner and a dielectric layer have been formed according to one embodiment of the present disclosure.

The disposable material layer 536 is then selectively removed by, for example, an etching process. A contact etch-stop liner 854 is formed over the structure, as shown in FIG. 8. For example, a contact etch-stop liner 854 is formed over and in contact with the STI structures 210, 212, any exposed portions of the semiconductor layer 106 between the STI structures 210, 212 and the silicide areas 432, 434, any exposed portions of the semiconductor layer 106 between the silicide areas 432, 434 and the spacer 322, the silicide areas 432, 434, and a portion of the replacement gate structure 314 (the nitride spacer 322 and portion 750 of the polysilicon layer 318 implanted with Ge atoms that extends above the top surface 752 of the spacer 322). In embodiments, the contact etch stop liner 854 comprises, for example, nitride, and can be formed using any conventional deposition process such as, for example, CVD.

Figure 9:
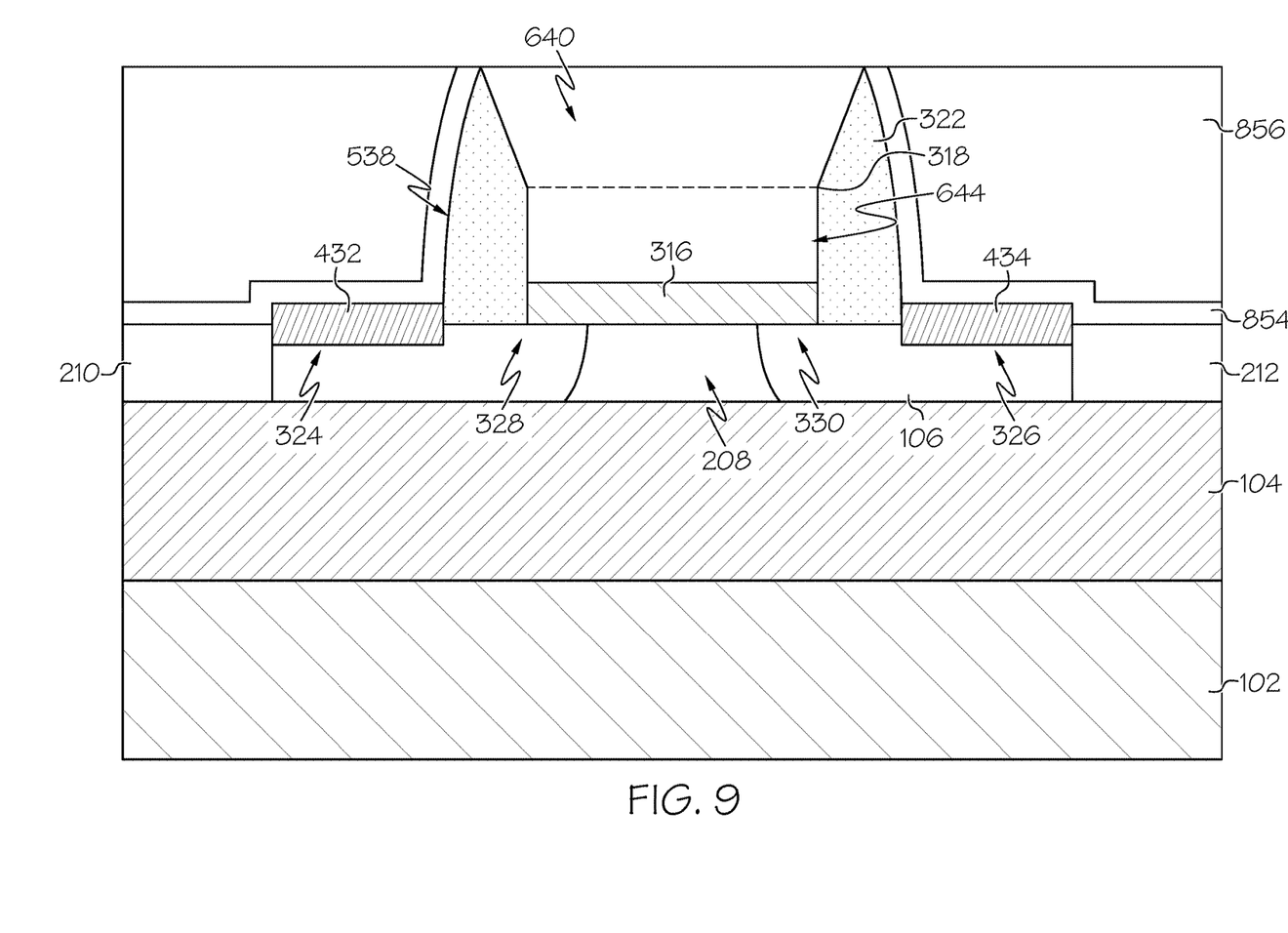
FIG. 9 is a cross-sectional view of the semiconductor structure after the dielectric layer and a portion of the expanded polysilicon layer have been etched and polished according to one embodiment of the present disclosure.
Figure 10:
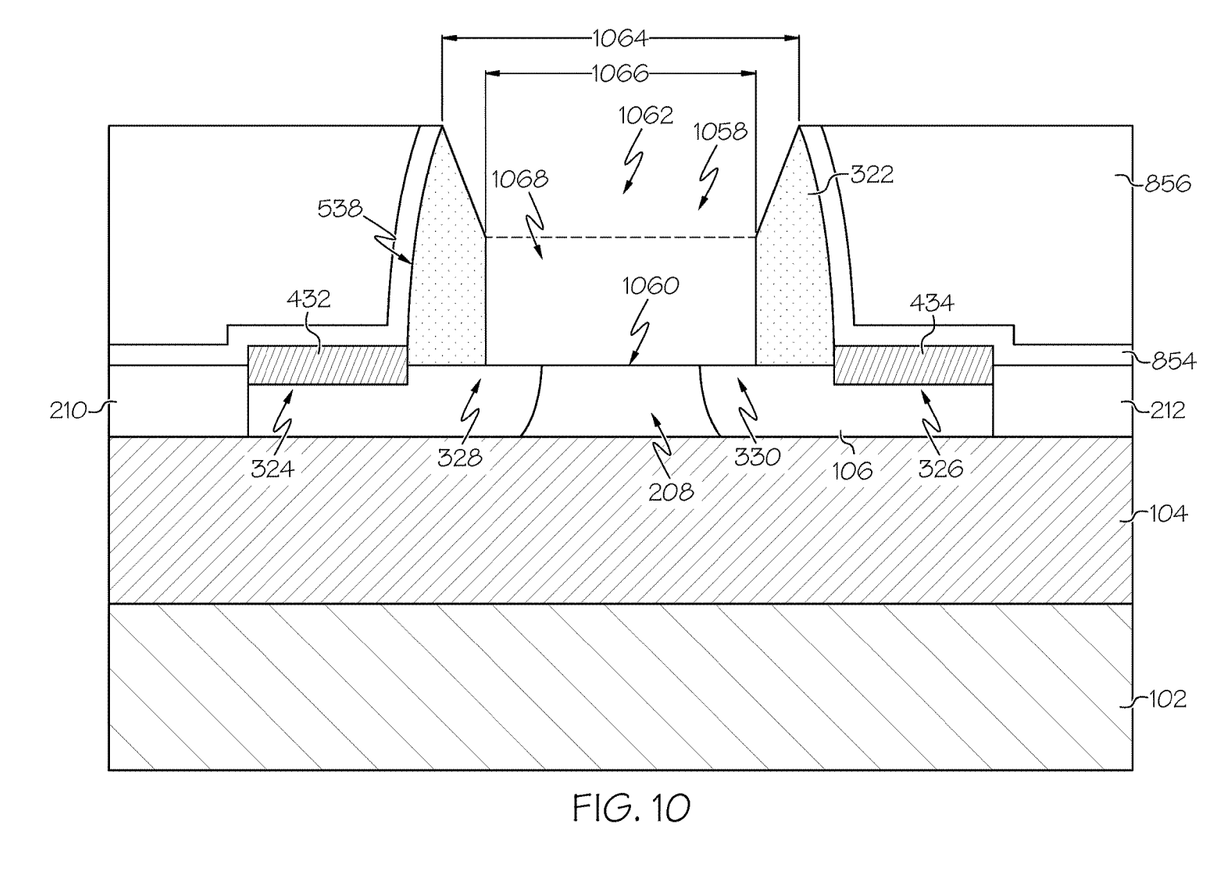
FIG. 10 is a cross-sectional view of the semiconductor structure after the replacement gate structure has been removed according to one embodiment of the present disclosure.

A dielectric layer 856 (e.g., an oxide layer, nitride layer, low-k material or any suitable combination of those materials) is formed over the entire structure. This dielectric layer 856 is then etched down to the level of the top surface of the gate spacer 322, as shown in FIG. 9. This process removes the portion 750 of the polysilicon layer 318 that extends above the top surface 752 of the spacer 322, and the corresponding portion of the contact etch-stop liner 854. Then, the replacement gate 318, 316 is removed via selective etching or another technique to form a gate cavity 1058 that exposes a portion 1060 of the high-k dielectric layer 316 or a portion of the semiconductor layer 106 if the high-k dielectric have not been formed, as shown in FIG. 10. The gate cavity 1058 comprises a top portion 1062 that has been laterally expanded as a result of the lateral expansion of the polysilicon layer 318. A width 1064 of the top portion 1062 of the cavity 1058 is greater than a width 1066 of the bottom portion 1068 of the cavity 1058, both of which correspond to the top and bottom portions 640, 642 of the polysilicon layer 318 that has been removed. In one embodiment, the top portion 512 of the gate cavity layer is expanded laterally at least 10%. In other words, the width 1064 is at least 110% of the width 1066. In some embodiments, the top portion 1062 of the gate cavity 1058 comprises angled sidewalls, whereas the bottom portion 1068 of the gate cavity 1058 comprises vertical side s.

Figure 11:
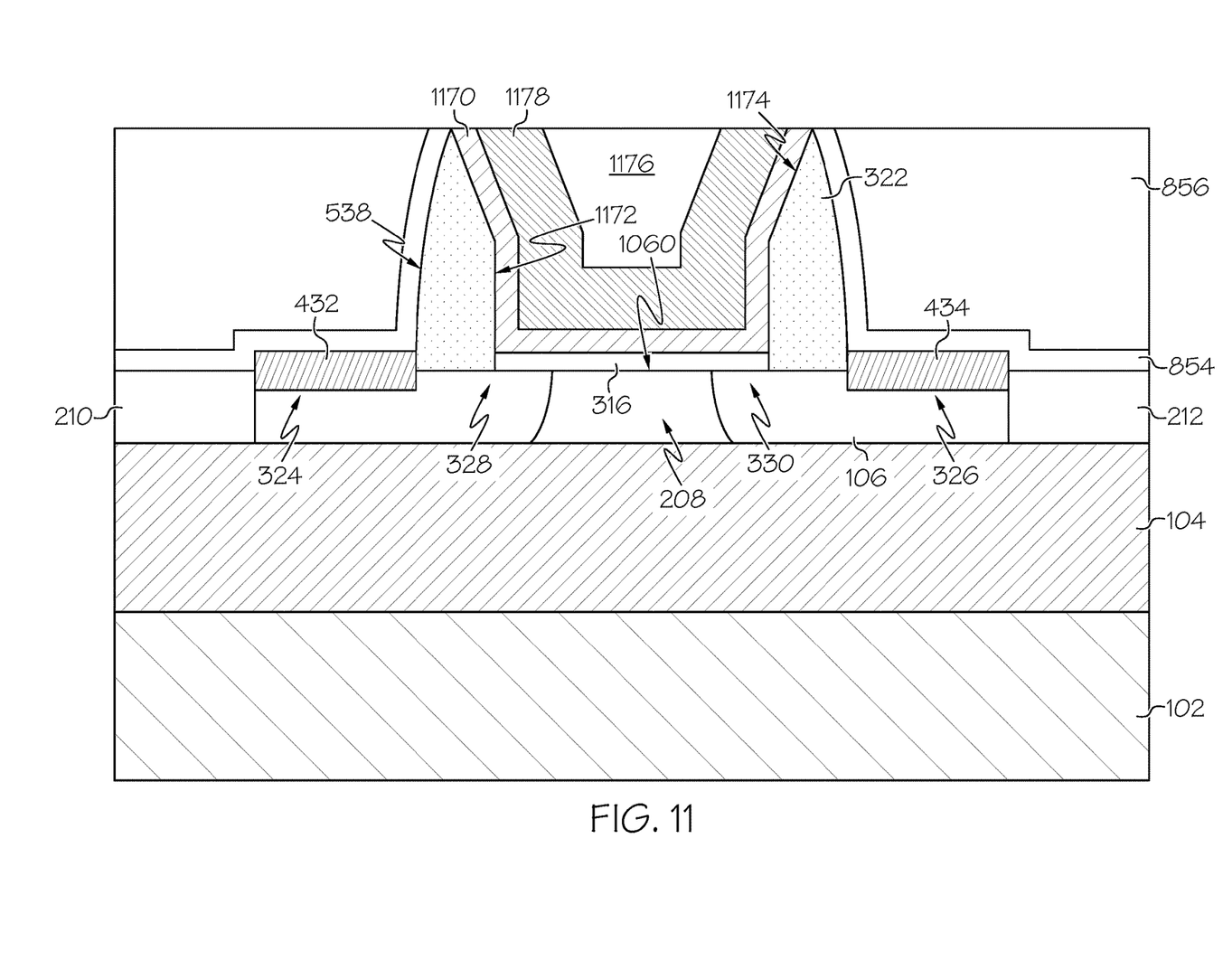
FIG. 11 is a cross-sectional view of the semiconductor structure after a replacement metal gate has been formed according to one embodiment of the present disclosure.

Once the polysilicon layer 318 has been removed, an RMG process is performed. For example, a high-k dielectric material is blanket deposited, for example by CVD (chemical vapor deposition), PECVD (plasma enhanced chemical vapor deposition), or ALD (Atomic layer deposition). The excessive high-k gate dielectric above the dielectric layer 856 can be removed, for example, by polishing such as chemically mechanical polishing (CMP) and/or etching to form a high-k gate dielectric layer 1170 on and in contact with the dielectric layer 316 (if formed), the vertical sidewalls 1172 of the spacer 322, and the angled sidewalls 1174 of the spacer 322.

Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum.

One or more conductive materials are then deposited on the high-k gate dielectric layer 1170 and etched/polished to form a metal gate 1176. The metal gate 1176 fills the remaining portion of the gate cavity 1058. In one embodiment, the conductive material comprises polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The conductive material may further comprise dopants that are incorporated during or after deposition. The conductive material may comprises multiple layers such as gate workfunction setting layer 1178 (work function metal) and gate conductive layer. In some embodiments, the dielectric layer 1170 is not formed and the gate workfunction setting layer is formed on and in contact with the dielectric layer 316 (if formed), the vertical sidewalls 1172 of the spacer 322, and the angled sidewalls 1174 of the spacer 322. An optional barrier layer such as TiN can be inserted into the interface between the WFM 1178 and the high-k gate dielectric layer 1170. Contacts (not shown) can then be formed for the silicide areas 432 and 434. One or more processes can be used to form the contacts.

It should be noted that although FIGS. 1-11 show only one semiconductor device being fabricated, embodiments of the present disclosure are applicable to fabricating multiple semiconductor devices (e.g., multiple nFETs or pFETS and/or nFETs and pFETS). It should be also noted that embodiments of the present disclosure are not limited to the processes discussed above with respect to FIGS. 1-11. Embodiments of the present disclosure are applicable to any semiconductor device and fabrication process that implements a replacement metal gate.

Figure 12:
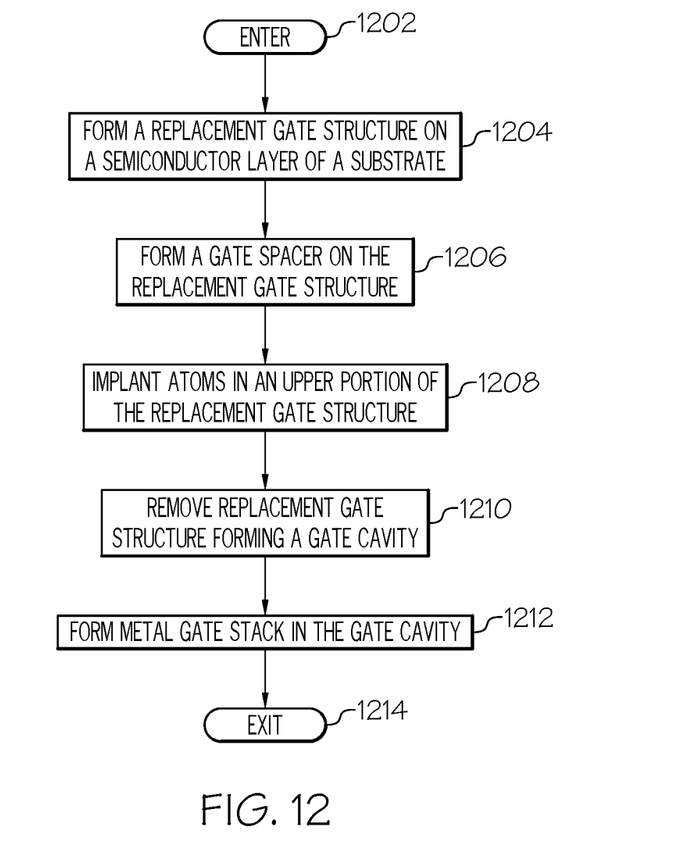
FIG. 12 is an operational flow diagram illustrating one process for forming silicide regions according to one embodiment of the present invention.

FIG. 12 is an operational flow diagram illustrating one process for forming a semiconductor device with a replacement metal gate comprising an expanded upper portion according to one embodiment of the present invention. In FIG. 12, the operational flow diagram begins at step 1202 and flows directly to step 1204. It should be noted that each of the steps shown in FIG. 12 has been discussed in greater detail above with respect to FIGS. 1-11. A replacement gate structure, at step 1204, is formed on a semiconductor layer of a substrate. The replacement gate structure comprises at least a polysilicon layer. After replacement gate structure has been formed, a gate spacer is formed on the replacement gate structure, at step 1206. Atoms, at step 1208, are implanted in an upper portion of the polysilicon layer. The implanting expands the upper portion of the polysilicon layer and a corresponding upper portion of the gate spacer in at least a lateral direction beyond a lower portion of the polysilicon layer and a lower portion of the gate spacer, respectively. After the implanting, the polysilicon layer is removed to form a gate cavity surrounded by the gate spacer, at step 1210. A metal gate stack, at step 1212, is formed within the gate cavity and in contact with sidewalls of the gate spacer. The metal gate stack comprises a upper portion having a width that is greater than a width of a lower portion of the metal gate stack. Additional fabrication processes such as contact formation can then be performed. The control flow exits at step 1214.

Although specific embodiments of the disclosure have been disclosed, those having ordinary skill in the art will understand that changes can be made to the specific embodiments without departing from the spirit and scope of the disclosure. The scope of the disclosure is not to be restricted, therefore, to the specific embodiments, and it is intended that the appended claims cover any and all such applications, modifications, and embodiments within the scope of the present disclosure.

It should be noted that some features of the present disclosure may be used in one embodiment thereof without use of other features of the present disclosure. As such, the foregoing description should be considered as merely illustrative of the principles, teachings, examples, and exemplary embodiments of the present disclosure, and not a limitation thereof.

Also that these embodiments are only examples of the many advantageous uses of the innovative teachings herein. In general, statements made in the specification of the present application do not necessarily limit any of the various claimed disclosures. Moreover, some statements may apply to some inventive features but not to others.

What is claimed is:

1. A semiconductor device comprising:
    a semiconductor layer formed on a substrate;
    silicide areas formed on source and drain regions; and
    a replacement gate formed over the semiconductor layer, the replacement gate comprising
    a dielectric layer comprising an upper portion having a width that is greater than a width of a lower portion of the dielectric layer, and
    a metal layer conforming to and in contact with the upper portion and lower portion of the dielectric layer, wherein the metal layer comprises an upper portion having a width that is greater than a width of a lower portion of the metal layer.

2. The semiconductor device of claim 1, further comprising:
    a gate spacer
    in contact with the dielectric layer.

3. The semiconductor device of claim 1, wherein the replacement gate further comprises:
    a work function metal layer conforming to the dielectric layer and formed between the dielectric layer and the metal layer.

4. The semiconductor device of claim 1, wherein the replacement gate comprises:
    a work function metal layer conforming to sidewalls of a gate spacer; and
    a metal layer formed on the work function metal.

5. The semiconductor device of claim 1, wherein sidewalls of the upper portion of the replacement gate are angled, and sidewalls of the lower portion of the replacement gate are vertical.

6. The semiconductor device of claim 1, further comprising:
a dielectric layer formed on the semiconductor layer, where the replacement gate is formed on and in contact with the dielectric layer.

7. The semiconductor device of claim 1, further comprising:
a gate spacer comprising an upper portion having angled sidewalls contacting sidewalls of the replacement metal gate and a lower portion having vertical sidewalls contacting sidewalls of the replacement metal gate.

8. The semiconductor device of claim 1, further comprising:
an active region defined within the semiconductor layer.

9. The semiconductor device of claim 1, further comprising:
isolation regions formed in the semiconductor layer.

10. The semiconductor device of claim 1, further comprising:
a protective liner in contact with at least the silicide areas.

11. An integrated circuit comprising:
a semiconductor device, the semiconductor device comprising
a semiconductor layer formed on a substrate;
silicide areas formed on source and drain regions; and
a replacement gate formed over the semiconductor layer, the replacement gate comprising
a dielectric layer comprising an upper portion having a width that is greater than a width of a lower portion of the dielectric layer, and
a metal layer conforming to and in contact with the upper portion and lower portion of the dielectric layer, wherein the metal layer comprises an upper portion having a width that is greater than a width of a lower portion of the metal layer.

12. The integrated circuit of claim 11, further comprising:
a gate spacer
in contact with the dielectric layer.

13. The integrated circuit of claim 11, wherein the replacement gate further comprises:
a work function metal layer conforming to the dielectric layer and formed between the dielectric layer and the metal layer.

14. The integrated circuit of claim 11, wherein the replacement gate comprises:
a work function metal layer conforming to sidewalls of a gate spacer; and
a metal layer formed on the work function metal.

15. The integrated circuit of claim 11, wherein sidewalls of the upper portion of the replacement gate are angled, and sidewalls of the lower portion of the replacement gate are vertical.

16. The integrated circuit of claim 11, wherein the semiconductor device comprises:
a dielectric layer formed on the semiconductor layer, where the replacement gate is formed on and in contact with the dielectric layer.

17. The integrated circuit of claim 11, wherein the semiconductor device comprises:
a gate spacer comprising an upper portion having angled sidewalls contacting sidewalls of the replacement metal gate and a lower portion having vertical sidewalls contacting sidewalls of the replacement metal gate.

18. The integrated circuit of claim 11, wherein the semiconductor device further comprises:
an active region defined within the semiconductor layer.

19. The integrated circuit of claim 11, wherein the semiconductor device further comprises:
isolation regions formed in the semiconductor layer.

20. The integrated circuit of claim 11, wherein the semiconductor device further comprises:
a protective liner in contact with at least the silicide areas.

* * * * *